(12) United States Patent
Qian et al.

(10) Patent No.: US 12,491,604 B2
(45) Date of Patent: Dec. 9, 2025

(54) CHEMICAL MECHANICAL POLISHING PAD

(71) Applicants: Rohm and Haas Electronic Materials CMP Holdings, Inc., Newark, DE (US); Dow Global Technologies LLC, Midland, MI (US)

(72) Inventors: Bainian Qian, Newark, DE (US); Marty W. DeGroot, Middletown, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 17/661,611

(22) Filed: May 2, 2022

(65) Prior Publication Data
US 2022/0266416 A1    Aug. 25, 2022

Related U.S. Application Data

(63) Continuation of application No. 16/415,464, filed on May 17, 2019, now Pat. No. 11,396,081, which is a continuation of application No. 14/261,893, filed on Apr. 25, 2014, now abandoned.

(51) Int. Cl.
*B24B 37/24* (2012.01)
*H01L 21/306* (2006.01)
*H01L 21/3105* (2006.01)

(52) U.S. Cl.
CPC ........ *B24B 37/24* (2013.01); *H01L 21/30625* (2013.01); *H01L 21/31053* (2013.01)

(58) Field of Classification Search
CPC ......... B24B 37/24; B24B 37/20; B24B 37/26; H01L 21/30625; H01L 21/31053; H01L 21/306
See application file for complete search history.

(56) References Cited

U.S. PATENT DOCUMENTS

| 3,577,257 A * | 5/1971 | Hutzler et al. | B05D 1/36 427/203 |
| 2005/0171225 A1* | 8/2005 | Kulp | C08G 18/4854 521/155 |
| 2008/0182492 A1* | 7/2008 | Crkvenac | B24B 11/04 451/527 |
| 2010/0029185 A1* | 2/2010 | Fukuda | B24D 11/001 427/245 |
| 2010/0035529 A1* | 2/2010 | Kulp | B24D 3/32 451/540 |
| 2011/0021123 A1* | 1/2011 | Kulp | C08G 18/4854 451/548 |
| 2013/0084702 A1* | 4/2013 | Xie | C08G 18/4825 451/526 |

FOREIGN PATENT DOCUMENTS

JP    2008168589 A  *  7/2008  ............ B24B 37/24

OTHER PUBLICATIONS

JP-2008168589-A, machine translation (Year: 2008).*

* cited by examiner

*Primary Examiner* — Amber R Orlando
*Assistant Examiner* — Marites A Guino-O Uzzle
(74) *Attorney, Agent, or Firm* — Blake T. Biederman

(57) ABSTRACT

A chemical mechanical polishing pad is provided containing a polishing layer having a polishing surface, wherein the polishing layer comprises a reaction product of ingredients, including: an isocyanate terminated urethane prepolymer; and, a curative system, containing a high molecular weight polyol curative; and, a difunctional curative.

5 Claims, No Drawings

CHEMICAL MECHANICAL POLISHING PAD

This application is a continuation of U.S. application Ser. No. 16/415,464, filed May 17, 2019, now U.S. Pat. No. 11,396,081, which was a continuation of U.S. application Ser. No. 14/261,893, filed Apr. 25, 2014, now abandoned.

The present invention relates to chemical mechanical polishing pads and methods of making and using the same. More particularly, the present invention relates to a chemical mechanical polishing pad comprising a polishing layer, wherein the polishing layer exhibits a density of greater than 0.6 g/cm$^3$; a Shore D hardness of 40 to 60; an elongation to break of 125 to 300%; a G' 30/90 ratio of 1.5 to 4; a tensile modulus of 100 to 300 (MPa); a wet cut rate of 4 to 10 µm/min; a 300 mm TEOS removal rate to Shore D hardness ratio (TEOS$_{300-RR}$/Shore D hardness) of >28; and, wherein the polishing layer has a polishing surface adapted for polishing the substrate.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others. Common removal techniques include wet and dry isotropic and anisotropic etching, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. To effect polishing, the polishing pad and wafer typically rotate relative to one another. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

Pad surface "conditioning" or "dressing" is critical to maintain a consistent polishing surface for stable polishing performance. Over time the polishing surface of the polishing pad wears down, smoothing over the microtexture of the polishing surface—a phenomenon called "glazing". Polishing pad conditioning is typically achieved by abrading the polishing surface mechanically with a conditioning disk. The conditioning disk has a rough conditioning surface typically comprised of embedded diamond points. The conditioning disk is brought into contact with the polishing surface either during intermittent breaks in the CMP process when polishing is paused ("ex situ"), or while the CMP process is underway ("in situ"). Typically the conditioning disk is rotated in a position that is fixed with respect to the axis of rotation of the polishing pad, and sweeps out an annular conditioning region as the polishing pad is rotated. The conditioning process as described cuts microscopic furrows into the pad surface, both abrading and plowing the pad material and renewing the polishing texture.

Semiconductor devices are becoming increasingly complex with finer features and more metallization layers. This trend requires improved performance from polishing consumables in order to maintain planarity and limit polishing defects. The latter can create electrical breaks or shorts of the conducting lines that would render the semiconductor device non-functional. It is generally known that one approach to reduce polishing defects, such as micro-scratches or chatter marks, is to use a softer polishing pad.

A family of soft polyurethane polishing layers are disclosed by James, et al. in U.S. Pat. No. 7,074,115. James et al. discloses a polishing pad comprising a the reaction product of an isocyanate-terminated urethane prepolymer with an aromatic diamine or polyamine curative, wherein the reaction product exhibits a porosity of at least 0.1 volume percent, a KEL energy loss factor at 40° C. and a 1 rad/sec of 385 to 750 I/Pa, and a modulus E' at 40° C. and 1 rad/sec of 100 to 400 MPa.

As described above, it is necessary to diamond condition the surface of chemical mechanical polishing pads to create a favorable microtexture for optimum polishing performance. However, it is difficult to create such texture in conventional polishing layer materials, such as those described by James et al., because these materials exhibit a high ductility, as measured by tensile elongation to break values. As a result, when these materials are subjected to conditioning with a diamond conditioning disk, rather than cutting furrows into the pad's surface, the diamonds in the conditioning disk simply push the pad material aside without cutting. Hence, very little texture is created in the surface of these conventional materials as a result of conditioning with a diamond conditioning disk.

Another related problem with these conventional chemical mechanical polishing pad materials arises during the machining process to form macro groove patterns in the pad surface. Conventional chemical mechanical polishing pads are typically provided with a groove pattern cut into their polishing surface to promote slurry flow and to remove polishing debris from the pad-wafer interface. Such grooves are frequently cut into the polishing surface of the polishing pad either using a lathe or by a CNC milling machine. With soft pad materials, however, a similar problem to that of diamond conditioning occurs, such that after the cutting bit has passed, the pad material simply rebounds and the grooves formed close in on themselves. Thus groove quality is poor and it is more difficult to successfully manufacture commercially acceptable pads with such soft materials. This problem worsens as the hardness of the pad material decreases.

Accordingly, there is a continuing need for chemical mechanical polishing pads that provide a physical property profile that correlates well with that associated with low defect formulations, but which also imparts enhanced conditionability to the polishing layer (i.e., exhibits a cut rate of 25 to 150 µm/hr).

The present invention provides a chemical mechanical polishing pad, comprising: a polishing layer having a polishing surface, wherein the polishing layer comprises a reaction product of ingredients, comprising: an isocyanate terminated urethane prepolymer having 8.5 to 9.5 wt % unreacted NCO groups; and, a curative system, comprising: 10 to 60 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 40 to 90 wt % of a difunctional curative.

The present invention provides a chemical mechanical polishing pad, comprising: a polishing layer having a polishing surface, wherein the polishing layer comprises a reaction product of ingredients, comprising: an isocyanate terminated urethane prepolymer having 8.5 to 9.5 wt % unreacted NCO groups; and, a curative system, comprising: 10 to 60 wt % of a high molecular weight polyol curative, wherein the high molecular weight polyol curative has a number average molecular weight, $M_N$, of 2,500 to 100,000; wherein the high molecular weight polyol curative has an average of 3 to 10 hydroxyl groups per molecule; and, 40 to 90 wt % of a difunctional curative; and, wherein the polishing surface is adapted for polishing a substrate selected from the group consisting of at least one of a magnetic substrate, an optical substrate and a semiconductor substrate.

The present invention provides a chemical mechanical polishing pad, comprising: a polishing layer having a polishing surface, wherein the polishing layer comprises a reaction product of ingredients, comprising: an isocyanate terminated urethane prepolymer having 8.5 to 9.5 wt % unreacted NCO groups; and, a curative system, comprising: 10 to 60 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 40 to 90 wt % of a difunctional curative; wherein the curative system has a plurality of reactive hydrogen groups and the isocyanate terminated urethane prepolymer has a plurality of unreacted NCO groups; and, wherein a stoichiometric ratio of the reactive hydrogen groups to the unreacted NCO groups is 0.85 to 1.15.

The present invention provides a chemical mechanical polishing pad, comprising: a polishing layer having a polishing surface, wherein the polishing layer comprises a reaction product of ingredients, comprising: an isocyanate terminated urethane prepolymer having 8.5 to 9.5 wt % unreacted NCO groups; and, a curative system, comprising: 10 to 60 wt % of a high molecular weight polyol curative, wherein the high molecular weight polyol curative has a number average molecular weight, $M_N$, of 2,500 to 100,000; wherein the high molecular weight polyol curative has an average of 3 to 10 hydroxyl groups per molecule; and, 40 to 90 wt % of a difunctional curative; and, wherein the polishing layer exhibits a density of greater than 0.6 g/cm³; a Shore D hardness of 40 to 60; an elongation to break of 125 to 300%; a G' 30/90 ratio of 1.5 to 4; a tensile modulus of 100 to 300 (MPa); a wet cut rate of 4 to 10 μm/min; and, a 300 mm TEOS removal rate to Shore D hardness ratio ($TEOS_{300-RR}$/Shore D hardness) of >28.

The present invention provides a chemical mechanical polishing pad, comprising: a polishing layer having a polishing surface, wherein the polishing layer comprises a reaction product of ingredients, comprising: an isocyanate terminated urethane prepolymer having 8.95 to 9.25 wt % unreacted NCO groups; and, a curative system, comprising: 10 to 60 wt % of a high molecular weight polyol curative, wherein the high molecular weight polyol curative has a number average molecular weight, $M_N$, of 2,500 to 100,000; wherein the high molecular weight polyol curative has an average of 3 to 10 hydroxyl groups per molecule; and, 40 to 90 wt % of a difunctional curative; and, wherein the polishing layer exhibits a density of greater than 0.6 g/cm³; a Shore D hardness of 40 to 60; an elongation to break of 125 to 300%; a G' 30/90 ratio of 1.5 to 4; a tensile modulus of 100 to 300 (MPa); a wet cut rate of 4 to 10 μm/min; and, a 300 mm TEOS removal rate to Shore D hardness ratio ($TEOS_{300-RR}$/Shore D hardness) of >28.

The present invention provides a chemical mechanical polishing pad, comprising: a polishing layer having a polishing surface, wherein the polishing layer comprises a reaction product of ingredients, comprising: an isocyanate terminated urethane prepolymer having 8.5 to 9.5 wt % unreacted NCO groups; and, a curative system, comprising: 10 to 60 wt % of a high molecular weight polyol curative, wherein the high molecular weight polyol curative has a number average molecular weight, $M_N$, of 2,500 to 100,000; wherein the high molecular weight polyol curative has an average of 3 to 10 hydroxyl groups per molecule; and, 40 to 90 wt % of a difunctional curative; and, wherein the polishing surface has a spiral groove pattern formed therein; wherein the polishing surface is adapted for polishing a substrate selected from the group consisting of at least one of a magnetic substrate, an optical substrate and a semiconductor substrate.

present invention provides a method of making a chemical mechanical polishing pad according to the present invention, comprising: providing an isocyanate terminated urethane prepolymer having 8.5 to 9.5 wt % unreacted NCO groups; and, providing a curative system, comprising: 10 to 60 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 40 to 90 wt % of a difunctional curative; and, combining the isocyanate terminated urethane prepolymer and the curative system to form a combination; allowing the combination to react to form a product; forming a polishing layer from the product; and, forming the chemical mechanical polishing pad with the polishing layer.

present invention provides a method of making a chemical mechanical polishing pad according to the present invention, comprising: providing an isocyanate terminated urethane prepolymer having 8.5 to 9.5 wt % unreacted NCO groups; providing a plurality of microelements; and, providing a curative system, comprising: 10 to 60 wt % of a high molecular weight polyol curative, wherein the high molecular weight polyol curative has a number average molecular weight, $M_N$, of 2,500 to 100,000; and wherein the high molecular weight polyol curative has an average of 3 to 10 hydroxyl groups per molecule; and, 40 to 90 wt % of a difunctional curative; and, combining the isocyanate terminated urethane prepolymer, the plurality of microelements and the curative system to form a combination; allowing the combination to react to form a product; forming a polishing layer from the product; and, forming the chemical mechanical polishing pad with the polishing layer.

The present invention provides a method of polishing a substrate, comprising: providing a chemical mechanical polishing apparatus having a platen; providing at least one substrate; providing a chemical mechanical polishing pad according to the present invention; installing onto the platen the chemical mechanical polishing pad; optionally, providing a polishing medium at an interface between the polishing surface and the substrate; creating dynamic contact between the polishing surface and the substrate, wherein at least some material is removed from the substrate.

The present invention provides a method of polishing a substrate, comprising: providing a chemical mechanical polishing apparatus having a platen; providing at least one substrate, wherein the at least one substrate is selected from the group consisting of at least one of a magnetic substrate, an optical substrate and a semiconductor substrate; providing a chemical mechanical polishing pad according to the present invention; installing onto the platen the chemical mechanical polishing pad; optionally, providing a polishing medium at an interface between the polishing surface and the substrate; creating dynamic contact between the polishing surface and the substrate, wherein at least some material is removed from the substrate.

DETAILED DESCRIPTION

The chemical mechanical polishing pad of the present invention has a polishing layer that exhibits both a desirable balance of physical properties that correlates well with low defect polishing performance and conditionability to facilitate the formation of microtexture using a diamond conditioning disk, while maintaining a high polishing rate. Accordingly, the balance of properties enabled by the polishing layer of the present invention provides the ability to, for example, polish semiconductor wafers at an efficient rate without damaging the wafer surface by creating microscratch defects that could compromise the electrical integrity of the semiconductor device.

The term "polishing medium" as used herein and in the appended claims encompasses particle containing polishing solutions and non particle containing polishing solutions, such as abrasive free and reactive liquid polishing solutions.

The term "$TEOS_{300\text{-}RR}$/Shore D Hardness" as used herein and in the appended claims is the ratio of TEOS removal rate to Shore D hardness for a given polishing layer defined as follows:

$$TEOS_{300\text{-}RR}/\text{Shore D Hardness} = (TEOS_{300\text{-}RR}) \div \text{Shore D Hardness}$$

wherein the $TEOS_{300\text{-}RR}$ is the TEOS removal rate in Å/min for the polishing layer measured according to the procedure set forth herein below in the Polishing Examples; and, the Shore D Hardness is the hardness of the polishing layer measured according to ASTM D2240.

The term "G' 30/90 ratio" as used herein and in the appended claims is the ratio of the shear modulus (at 30° C.), $G'_{30}$, to the shear modulus (at 90° C.), $G'_{90}$, for a given polishing layer defined as follows:

$$G'\ 30/90\ \text{ratio} = G'_{30} \div G'_{90}$$

wherein $G'_{30}$ and $G'_{90}$ for the polishing layer are measured according to ASTM D5279-13 at 30° C. and 90° C., respectively.

The chemical mechanical polishing pad of the present invention, comprises: a polishing layer having a polishing surface, wherein the polishing layer comprises a reaction product of ingredients, comprising: an isocyanate terminated urethane prepolymer having 8.5 to 9.5 wt % (preferably, 8.75 to 9.5 wt %; more preferably, 8.75 to 9.25; most preferably, 8.95 to 9.25 wt %) unreacted NCO groups; and, a curative system, comprising: 10 to 60 wt % (preferably, 15 to 50 wt %; more preferably, 20 to 40 wt %; most preferably, 20 to 30 wt %) of a high molecular weight polyol curative having a number average molecular weight, $M_N$, of 2,500 to 100,000 (preferably 5,000 to 50,000; more preferably 7,500 to 25,000; most preferably, 10,000 to 12,000) and an average of three to ten (preferably, four to eight; more preferably, five to seven; most preferably, six) hydroxyl groups per molecule; and, 40 to 90 wt % (preferably, 50 to 85 wt %; more preferably, 60 to 80 wt %; most preferably, 70 to 80 wt %) of a difunctional curative.

The polishing surface of the polishing layer of the chemical mechanical polishing pad of the present invention is adapted for polishing a substrate. Preferably, the polishing surface is adapted for polishing a substrate selected from at least one of a magnetic substrate, an optical substrate and a semiconductor substrate. More preferably, the polishing surface is adapted for polishing a semiconductor substrate. Most preferably, the polishing surface is adapted for polishing a TEOS oxide surface of a semiconductor substrate.

Preferably, the polishing surface has macrotexture selected from at least one of perforations and grooves. Perforations can extend from the polishing surface part way or all the way through the thickness of the polishing layer. Preferably, grooves are arranged on the polishing surface such that upon rotation of the chemical mechanical polishing pad during polishing, at least one groove sweeps over the surface of the substrate being polished. Preferably, the polishing surface has macrotexture including at least one groove selected from the group consisting of curved grooves, linear grooves and combinations thereof.

Preferably, polishing layer of the chemical mechanical polishing pad of the present invention has a polishing surface with a macrotexture comprising a groove pattern formed therein. Preferably, the groove pattern comprises a plurality of grooves. More preferably, the groove pattern is selected from a groove design. Preferably, the groove design is selected from the group consisting of concentric grooves (which may be circular or spiral), curved grooves, cross hatch grooves (e.g., arranged as an X-Y grid across the pad surface), other regular designs (e.g., hexagons, triangles), tire tread type patterns, irregular designs (e.g., fractal patterns), and combinations thereof. More preferably, the groove design is selected from the group consisting of random grooves, concentric grooves, spiral grooves, cross-hatched grooves, X-Y grid grooves, hexagonal grooves, triangular grooves, fractal grooves and combinations thereof. Most preferably, the polishing surface has a spiral groove pattern formed therein. The groove profile is preferably selected from rectangular with straight side walls or the groove cross section may be "V" shaped, "U" shaped, saw tooth, and combinations thereof.

The isocyanate terminated urethane prepolymer used in the formation of the polishing layer of the chemical mechanical polishing pad of the present invention preferably comprises: a reaction product of ingredients, comprising: a polyfunctional isocyanate and a prepolymer polyol.

Preferably, the polyfunctional isocyanate is selected from the group consisting of an aliphatic polyfunctional isocyanate, an aromatic polyfunctional isocyanate and a mixture thereof. More preferably, the polyfunctional isocyanate is a diisocyanate selected from the group consisting of 2,4-toluene diisocyanate; 2,6-toluene diisocyanate; 4,4'-diphenylmethane diisocyanate; naphthalene-1,5-diisocyanate; tolidine diisocyanate; para-phenylene diisocyanate; xylylene diisocyanate; isophorone diisocyanate; hexamethylene diisocyanate; 4,4'-dicyclohexylmethane diisocyanate; cyclohexanediisocyanate; and, mixtures thereof.

Preferably, the prepolymer polyol is selected from the group consisting of diols, polyols, polyol diols, copolymers thereof, and mixtures thereof. More preferably, the prepolymer polyol is selected from the group consisting of polyether polyols (e.g., poly(oxytetramethylene)glycol, poly(oxypropylene)glycol, poly(oxyethylene)glycol); polycarbonate polyols; polyester polyols; polycaprolactone polyols; mixtures thereof and, mixtures thereof with one or more low molecular weight polyols selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Still more preferably, the prepolymer polyol is selected from the group consisting of at least one of polytetramethylene ether glycol (PTMEG); polypropylene ether glycols (PPG), and polyethylene ether glycols (PEG); optionally, mixed with at least one low molecular weight polyol selected from the group consisting of ethylene glycol; 1,2-propylene glycol; 1,3-propylene glycol; 1,2-butanediol; 1,3-butanediol; 2-methyl-1,3-propanediol; 1,4-butanediol; neopentyl glycol; 1,5-pentanediol; 3-methyl-1,5-pentanediol; 1,6-hexanediol; diethylene glycol; dipropylene glycol; and, tripropylene glycol. Most preferably, the prepolymer polyol is primarily (i.e., >90 wt %) PTMEG.

Preferably, the isocyanate terminated urethane prepolymer has an unreacted isocyanate (NCO) concentration of 8.5 to 9.5 wt % (more preferably, 8.75 to 9.5 wt %; still more preferably, 8.75 to 9.25; most preferably, 8.95 to 9.25 wt %). Examples of commercially available isocyanate terminated urethane prepolymers include Imuthane® prepolymers (available from COIM USA, Inc., such as, PET-80A, PET-85A, PET-90A, PET-93A, PET-95A, PET-60D, PET-70D, PET-75D); Adiprene® prepolymers (available from Chemtura, such as, LF 800A, LF 900A, LF 910A, LF 930A, LF 931A, LF 939A, LF 950A, LF 952A, LF 600D, LF 601D, LF 650D, LF 667, LF 700D, LF750D, LF751D, LF752D, LF753D and L325); Andur® prepolymers (available from Anderson Development Company, such as, 70APLF, 80APLF, 85APLF, 90APLF, 95APLF, 60DPLF, 70APLF, 75APLF).

Preferably, the isocyanate terminated urethane prepolymer is a low free isocyanate terminated urethane prepolymer having less than 0.1 wt % free toluene diisocyanate (TDI) monomer content.

The curative system used in the formation of the polishing layer of the chemical mechanical polishing pad of the present invention preferably contains: 10 to 60 wt % (preferably 15 to 50 wt %; more preferably 20 to 40 wt %; most preferably 20 to 30 wt %) of a high molecular weight polyol curative; and, 40 to 90 wt % (preferably 50 to 85 wt %; more preferably 60 to 80 wt %; most preferably 70 to 80 wt %) of a difunctional curative.

Preferably, the high molecular weight polyol curative has a number average molecular weight, $M_N$, of 2,500 to 100,000. More preferably, the high molecular weight polyol curative used has a number average molecular weight, $M_N$, of 5,000 to 50,000 (still more preferably 7,500 to 25,000; most preferably 10,000 to 12,000).

Preferably, the high molecular weight polyol curative has an average of three to ten hydroxyl groups per molecule. More preferably, the high molecular weight polyol curative used has an average of four to eight (still more preferably five to seven; most preferably six) hydroxyl groups per molecule.

Examples of commercially available high molecular weight polyol curatives include Specflex® polyols, Voranol® polyols and Voralux® polyols (available from The Dow Chemical Company); Multranol® Specialty Polyols and Ultracel® Flexible Polyols (available from Bayer MaterialScience LLC); and Pluracol® Polyols (available from BASF). A number of preferred high molecular weight polyol curatives are listed in TABLE 1.

TABLE 1

| High molecular weight polyol curative | Number of OH groups per molecule | $M_N$ | Hydroxyl Number (mg KOH/g) |
| --- | --- | --- | --- |
| Multranol ® 3901 Polyol | 3.0 | 6,000 | 28 |
| Pluracol ® 1385 Polyol | 3.0 | 3,200 | 50 |
| Pluracol ® 380 Polyol | 3.0 | 6,500 | 25 |
| Pluracol ® 1123 Polyol | 3.0 | 7,000 | 24 |
| ULTRACEL ® 3000 Polyol | 4.0 | 7,500 | 30 |
| SPECFLEX ® NC630 Polyol | 4.2 | 7,602 | 31 |
| SPECFLEX ® NC632 Polyol | 4.7 | 8,225 | 32 |
| VORALUX ® HF 505 Polyol | 6.0 | 11,400 | 30 |
| MULTRANOL ® 9185 Polyol | 6.0 | 3,366 | 100 |
| VORANOL ® 4053 Polyol | 6.9 | 12,420 | 31 |

Preferably, the difunctional curative is selected from diols and diamines. More preferably, the difunctional curative used is a diamine selected from the group consisting of primary amines and secondary amines. Still more preferably, the difunctional curative used is selected from the group consisting of diethyltoluenediamine (DETDA); 3,5-dimethylthio-2,4-toluenediamine and isomers thereof; 3,5-diethyltoluene-2,4-diamine and isomers thereof (e.g., 3,5-diethyltoluene-2,6-diamine); 4,4'-bis-(sec-butylamino)-diphenylmethane; 1,4-bis-(sec-butylamino)-benzene; 4,4'-methylene-bis-(2-chloroaniline); 4,4'-methylene-bis-(3-chloro-2,6-diethylaniline) (MCDEA); polytetramethyleneoxide-di-p-aminobenzoate; N,N'-dialkyldiamino diphenyl methane; p,p'-methylene dianiline (MDA); m-phenylenediamine (MPDA); 4,4'-methylene-bis-(2-chloroaniline) (MBOCA); 4,4'-methylene-bis-(2,6-diethylaniline) (MDEA); 4,4'-methylene-bis-(2,3-dichloroaniline) (MDCA); 4,4'-diamino-3,3'-diethyl-5,5'-dimethyl diphenylmethane, 2,2',3,3'-tetrachloro diamino diphenylmethane; trimethylene glycol di-p-aminobenzoate; and mixtures thereof. Most preferably, the diamine curing agent used is selected from the group consisting of 4,4'-methylene-bis-(2-chloroaniline) (MBOCA); 4,4'-methylene-bis-(3-chloro-2,6-diethylaniline) (MCDEA); and, isomers thereof.

Preferably, the sum of the reactive hydrogen groups (i.e., the sum of the amine ($NH_2$) groups and the hydroxyl (OH) groups) contained in the components of the curative system (i.e., the high molecular weight polyol curative and the difunctional curative) divided by the unreacted isocyanate (NCO) groups in the isocyanate terminated urethane prepolymer (i.e., the stoichiometric ratio) used in the formation of the polishing layer of the chemical mechanical polishing pad of the present invention is preferably 0.85 to 1.15 (more preferably 0.85 to 1.05; most preferably 0.85 to 1.0).

The polishing layer of the chemical mechanical polishing pad of the present invention optionally further comprises a plurality of microelements. Preferably, the plurality of microelements are uniformly dispersed throughout the polishing layer. Preferably, the plurality of microelements is selected from entrapped gas bubbles, hollow core polymeric materials, liquid filled hollow core polymeric materials, water soluble materials and an insoluble phase material (e.g., mineral oil). More preferably, the plurality of microelements is selected from entrapped gas bubbles and hollow core polymeric materials uniformly distributed throughout the polishing layer. Preferably, the plurality of microelements has a weight average diameter of less than 150 μm (more preferably, of less than 50 μm; most preferably of 10 to 50 μm). Preferably, the plurality of microelements comprise polymeric microballoons with shell walls of either polyacrylonitrile or a polyacrylonitrile copolymer (e.g., Expancel® microspheres from Akzo Nobel). Preferably, the plurality of microelements are incorporated into the polishing layer at 0 to 35 vol % porosity (more preferably 10 to 25 vol % porosity).

The polishing layer of the chemical mechanical polishing pad of the present invention can be provided in both porous and nonporous (i.e., unfilled) configurations. Preferably, the polishing layer of the chemical mechanical polishing pad of the present invention exhibits a density of >0.6 g/cm$^3$ as measured according to ASTM D1622. More preferably, the polishing layer of the chemical mechanical polishing pad of the present invention exhibits a density of 0.7 to 1.1 g/cm$^3$ (more preferably, 0.75 to 1.0; most preferably, 0.75 to 0.95) as measured according to ASTM D1622.

Preferably, the polishing layer of the chemical mechanical polishing pad of the present invention exhibits a Shore D hardness of 40 to 60 as measured according to ASTM D2240. More preferably, the polishing layer of the chemical mechanical polishing pad of the present invention exhibits a Shore D hardness of 45 to 55 (most preferably 50 to 55) as measured according to ASTM D2240.

Preferably, the polishing layer of the chemical mechanical polishing pad of the present invention exhibits an elongation to break of 125 to 300% (more preferably, 140 to 300%; most preferably, 150 to 200%) as measured according to ASTM D412.

Preferably, the polishing layer of the chemical mechanical polishing pad of the present invention exhibits a wet cut rate of 4 to 10 μm/min as measured using the method described herein in the Examples. More preferably, the polishing layer of the chemical mechanical polishing pad of the present invention exhibits a wet cut rate of 4.5 to 7 μm/min (still more preferably, 4.5 to 6 μm/min; most preferably, 4.5 to 5.5 μm/min) as measured using the method described herein in the Examples.

Preferably, the polishing layer of the chemical mechanical polishing pad of the present invention exhibits a shear modulus (at 30° C.), $G'_{30}$, of 50 to 250 MPa (more preferably, 50 to 200 MPa; most preferably, 100 to 200 MPa) as measured according to ASTM D5279-13.

Preferably, the polishing layer of the chemical mechanical polishing pad of the present invention exhibits a shear modulus (at 40° C.), $G'_{40}$, of 45 to 200 MPa as measured according to ASTM D5279-13.

Preferably, the polishing layer of the chemical mechanical polishing pad of the present invention exhibits a shear loss modulus (at 40° C.), $G''_{40}$, of 3 to 20 MPa as measured according to ASTM D5279-13.

Preferably, the polishing layer of the chemical mechanical polishing pad of the present invention exhibits a G' 30/90 ratio of 1.5 to 4 (more preferably, 2 to 4) as measured according to ASTM D5279-13.

Preferably, the polishing layer of the chemical mechanical polishing pad of the present invention exhibits a toughness of 20 to 70 MPa (more preferably, 20 to 50 MPa; most preferably, 25 to 40 MPa) as measured according to ASTM D1708-10.

Preferably, the polishing layer of the chemical mechanical polishing pad of the present invention exhibits a tensile strength of 10 to 35 MPa (more preferably, 15 to 30 MPa; most preferably, 15 to 25 MPa) as measured according to ASTM D1708-10.

Polishing layer materials exhibiting high elongation to break values tend to reversibly deform when subjected to machining operations, which results in groove formation that is unacceptably poor and texture creation during diamond conditioning that is insufficient. The unique curative system used in the formation of the polishing layer of the chemical mechanical polishing pad of the present invention provides both Shore D hardness of 40 to 60 coupled with an elongation to break of 125 to 300% as measured according to ASTM D412. Preferably, the polishing layer of the chemical mechanical polishing pad of the present invention exhibits both a Shore D hardness of 40 to 60 (preferably, 45 to 55; more preferably, 50 to 55) and an elongation to break of 140 to 300% (preferably 150 to 300%; more preferably 150 to 200%) as measured according to ASTM D412.

Softer polishing layer materials tend to polish substrates at a lower rate than harder polishing layer materials. Notwithstanding, softer polishing layer materials tend to create fewer polishing defects than harder polishing layer materials. The unique curative system used in the formation of the polishing layer of the chemical mechanical polishing pad of the present invention provides an improved $TEOS_{300-RR}$/Shore D hardness of >28 (preferably, of 28 to 100; more preferably, of 30 to 60; most preferably, of 30 to 50), wherein the $TEOS_{300-RR}$/Shore D hardness is measured under the conditions set forth herein in the Examples.

Preferably, the polishing layer has an average thickness of 20 to 150 mils. More preferably, the polishing layer has an average thickness of 30 to 125 mils (still more preferably 40 to 120 mils; most preferably 50 to 100 mils).

Preferably, the chemical mechanical polishing pad of the present invention is adapted to be interfaced with a platen of a polishing machine. Preferably, the chemical mechanical polishing pad is adapted to be affixed to the platen of a polishing machine. Preferably, the chemical mechanical polishing pad can be affixed to the platen using at least one of a pressure sensitive adhesive and vacuum.

The chemical mechanical polishing pad of the present invention optionally further comprises at least one additional layer interfaced with the polishing layer. Preferably, the chemical mechanical polishing pad optionally further comprises a compressible base layer adhered to the polishing layer. The compressible base layer preferably improves conformance of the polishing layer to the surface of the substrate being polished.

An important step in substrate polishing operations is determining an endpoint to the process. One popular in situ method for endpoint detection involves providing a polishing pad with a window, which is transparent to select wavelengths of light. During polishing, a light beam is directed through the window to the substrate surface, where it reflects and passes back through the window to a detector (e.g., a spectrophotometer). Based on the return signal, properties of the substrate surface (e.g., the thickness of films thereon) can be determined for endpoint detection purposes. To facilitate such light based endpoint methods, the chemical mechanical polishing pad of the present invention, optionally further comprises an endpoint detection window. Preferably, the endpoint detection window is selected from an integral window incorporated into the polishing layer; and, a plug in place endpoint detection window block incorporated into the chemical mechanical polishing pad. One of ordinary skill in the art will know to select an appropriate material of construction for the endpoint detection window for use in the intended polishing process.

Preferably, the method of making a chemical mechanical polishing pad of the present invention, comprises: providing an isocyanate terminated urethane prepolymer having 8.5 to 9.5 wt % (preferably, 8.75 to 9.5 wt %; more preferably, 8.75 to 9.25; most preferably, 8.95 to 9.25 wt %) unreacted NCO groups; and, providing a curative system, comprising: (i) providing 10 to 60 wt % (preferably, 15 to 50 wt %; more preferably, 20 to 40 wt %; most preferably, 20 to 30 wt %) of a high molecular weight polyol curative, wherein the high molecular weight polyol curative has a number average molecular weight, $M_N$, of 2,500 to 100,000 (preferably 5,000 to 50,000; more preferably 7,500 to 25,000; most preferably, 10,000 to 12,000); and wherein the high molecular weight polyol curative has an average of three to ten (preferably, four to eight; more preferably, five to seven; most preferably, six) hydroxyl groups per molecule; and, (ii) providing 40 to 90 wt % (preferably, 50 to 85 wt %; more preferably, 60 to 80 wt %; most preferably, 70 to 80 wt %) of a difunctional curative; combining the isocyanate terminated urethane prepolymer and the curative system to form a combination; allowing the combination to react to form a product; forming a polishing layer from the product; and, forming the chemical mechanical polishing pad with the polishing layer.

The method of making a chemical mechanical polishing pad of the present invention, optionally, further comprises: providing a plurality of microelements; and, wherein the plurality of microelements is combined with the isocyanate terminated urethane prepolymer and the curative system to form the combination.

The method of making a chemical mechanical polishing pad of the present invention, optionally, further comprises: providing a mold; pouring the combination into the mold; and, allowing the combination to react in the mold to form a cured cake; wherein the polishing layer is derived from the cured cake. Preferably, the cured cake is skived to derive multiple polishing layers from a single cured cake. Optionally, the method further comprises heating the cured cake to facilitate the skiving operation. Preferably, the cured cake is heated using infrared heating lamps during the skiving operation in which the cured cake is skived into a plurality of polishing layers.

The method of making the chemical mechanical polishing pad of the present invention, optionally, further comprises: providing at least one additional layer; and, interfacing the at least one additional layer with the polishing layer to form the chemical mechanical polishing pad. Preferably, the at least one additional layer is interfaced with the polishing layer by known techniques, such as, by using an adhesive (e.g., a pressure sensitive adhesive, a hot melt adhesive, a contact adhesive).

The method of making the chemical mechanical polishing pad of the present invention, optionally, further comprises: providing an endpoint detection window; and, incorporating the endpoint detection window into the chemical mechanical polishing pad.

The method of the present invention for chemical mechanical polishing of a substrate preferably comprises: providing a chemical mechanical polishing apparatus having a platen; providing at least one substrate to be polished (preferably, wherein the substrate is selected from the group consisting of at least one of a magnetic substrate, an optical substrate and a semiconductor substrate; more preferable, wherein the substrate is a semiconductor substrate; most preferably, wherein the substrate is a semiconductor wafer with an exposed TEOS surface); providing a chemical mechanical polishing pad of the present invention; installing onto the platen the chemical mechanical polishing pad; optionally, providing a polishing medium at an interface between a polishing surface of the chemical mechanical polishing pad and the substrate (preferably, wherein the polishing medium is selected from the group consisting of a polishing slurry and a non-abrasive containing reactive liquid formulation); creating dynamic contact between the polishing surface and the substrate, wherein at least some material is removed from the substrate; and, optionally, conditioning of the polishing surface with an abrasive conditioner. Preferably, in the method of the present invention, the chemical mechanical polishing apparatus provided further includes a light source and a photosensor (preferably a multisensor spectrograph); and, the chemical mechanical polishing pad provided further includes an endpoint detection window; and, the method further comprises: determining a polishing endpoint by transmitting light from the light source through the endpoint detection window and analyzing the light reflected off the surface of the substrate back through the endpoint detection window incident upon the photosensor.

Some embodiments of the present invention will now be described in detail in the following Examples.

Comparative Examples C1-C9 and Examples 1-14

Polishing layers were prepared according to the formulation details provided in TABLE 2. Specifically, polyurethane cakes were prepared by the controlled mixing of the isocyanate terminated urethane prepolymer at 51° C. with the components of the curative system. All of the raw materials, except for MBOCA, were maintained at a premixing temperature of 51° C. The MBOCA was maintained at a premixing temperature of 116° C. The ratio of the isocyanate terminated urethane prepolymer and the curative system was set such that the stoichiometry, as defined by the ratio of active hydrogen groups (i.e., the sum of the —OH groups and —NH$_2$ groups) in the curatives of the curative system to the unreacted isocyanate (NCO) groups in the isocyanate terminated urethane prepolymer, was as noted in TABLE 2.

Porosity was introduced into the polishing layers by adding Expancel® microspheres to the isocyanate terminated urethane prepolymer prior to combining with the curative system to achieve the desired porosity and pad density. The grade of Expancel® microspheres added in each of Comparative Examples C1-C9 and Examples 1-14 is noted in TABLE 2 along with the amount of the pore former added in wt %. Expancel® microspheres are available from Akzo Nobel.

The isocyanate terminated urethane prepolymer with the incorporated Expancel® microspheres and the curative system were mixed together using a high shear mix head. After exiting the mix head, the combination was dispensed over a period of 2 to 5 minutes into a 86.4 cm (34 inch) diameter circular mold to give a total pour thickness of 7 to 10 cm. The dispensed combination was allowed to gel for 15 minutes before placing the mold in a curing oven. The mold was then cured in the curing oven using the following cycle: 30 minutes ramp from ambient temperature to a set point of 104° C., then hold for 15.5 hours at 104° C., and then 2 hour ramp from 104° C. to 21° C.

The cured polyurethane cakes were then removed from the mold and skived (cut using a moving blade) at a temperature of 30 to 80° C. into approximately forty separate 2.0 mm (80 mil) thick sheets. Skiving was initiated from the top of each cake. Any incomplete sheets were discarded.

having a nominal diameter of 22.86 cm (9 inches). Polishing layers having a circular cross section were prepared as described herein in the Examples. The polishing layers were

TABLE 2

| Ex # | Isocyanate terminated urethane prepolymer | (% NCO) | Curative System | | | Stoich. (Active H/NCO) | Expancel® Pore Former | Pore Former (wt %) | Porosity (vol %) |
|---|---|---|---|---|---|---|---|---|---|
| | | | Difunctional curative (DC) | DC (wt %) | Voralux® HF 505 (wt %) | | | | |
| C1 | Adiprene® L325 | 9.1 | MbOCA | 100 | — | 0.87 | 551DE40d42 | 1.70 | 32 |
| C2 | Adiprene® LF750D | 8.9 | MbOCA | 100 | — | 1.05 | 551DE20d60 | 1.10 | 19 |
| C3 | Adiprene® LFG740D | 8.9 | MbOCA | 100 | — | 0.91 | 551DE40d42 | 0.19 | 9 |
| C4 | 50/50 wt % blend of Adiprene® LF750D Adiprene® LFG963A | 7.3 | MbOCA | 100 | — | 0.97 | 551DE20d60 | 2.00 | 31 |
| C5 | 80/20 wt % blend of Adiprene® LF750D Adiprene® LFG963A | 8.3 | MbOCA | 100 | — | 0.89 | 461DE20d70 | 2.59 | 31 |
| C6 | 70/30 wt % blend of Adiprene® LF750D Adiprene® LFG963A | 7.9 | MbOCA | 100 | — | 0.89 | 461DE20d70 | 2.59 | 31 |
| C7 | 50/50 wt % blend of Adiprene® LF750D Adiprene® LFG963A | 7.3 | MbOCA | 100 | — | 0.87 | 461DE20d70 | 2.85 | 32 |
| C8 | Adiprene® LFG963A | 5.7 | MCDEA | 100 | — | 1.03 | 461DE20d70 | 2.06 | 27 |
| C9 | Adiprene® LFG963A | 5.7 | MbOCA | 100 | — | 0.90 | 551DE40d42 | 1.25 | 25 |
| 1 | Adiprene® L325 | 9.1 | MbOCA | 42.2 | 57.8 | 0.87 | 461DE20d70 | 2.48 | 30 |
| 2 | Adiprene® L325 | 9.1 | MbOCA | 42.5 | 57.5 | 0.87 | 461DE20d70 | 1.38 | 21 |
| 3 | Adiprene® L325 | 9.1 | MbOCA | 49.6 | 50.4 | 0.87 | 461DE20d70 | 2.58 | 31 |
| 4 | Adiprene® L325 | 9.1 | MbOCA | 50.0 | 50.0 | 0.87 | 461DE20d70 | 1.41 | 23 |
| 5 | Adiprene® L325 | 9.1 | MbOCA | 53.5 | 46.5 | 1.05 | 461DE20d70 | 2.48 | 29 |
| 6 | Adiprene® L325 | 9.1 | MbOCA | 53.9 | 46.1 | 1.05 | 461DE20d70 | 1.42 | 20 |
| 7 | Adiprene® L325 | 9.1 | MbOCA | 58.6 | 41.4 | 0.87 | 461DE20d70 | 2.69 | 30 |
| 8 | Adiprene® L325 | 9.1 | MbOCA | 59.0 | 41.0 | 0.87 | 461DE20d70 | 1.45 | 19 |
| 9 | Adiprene® L325 | 9.1 | MbOCA | 62.3 | 37.7 | 1.05 | 461DE20d70 | 2.59 | 31 |
| 10 | Adiprene® L325 | 9.1 | MbOCA | 62.6 | 37.4 | 1.05 | 461DE20d70 | 1.47 | 24 |
| 11 | Adiprene® L325 | 9.1 | MbOCA | 75.0 | 25.0 | 0.87 | 461DE20d70 | 2.85 | 32 |
| 12 | Adiprene® L325 | 9.1 | MbOCA | 77.7 | 22.3 | 1.05 | 461DE20d70 | 2.74 | 30 |
| 13 | Adiprene® L325 | 9.1 | MbOCA | 77.9 | 22.1 | 1.05 | 461DE20d70 | 1.50 | 23 |
| 14 | Adiprene® L325 | 9.1 | MbOCA | 86.2 | 13.8 | 0.87 | 461DE20d70 | 2.94 | 33 |

Adiprene® L325 isocyanate terminated urethane prepolymer is available from Chemtura Corporation.
Adiprene® LF750D isocyanate terminated urethane prepolymer is available from Chemtura Corporation.
Adiprene® LFG740D isocyanate terminated urethane prepolymer is available from Chemtura Corporation.
Adiprene® LFG963A isocyanate terminated urethane prepolymer is available from Chemtura Corporation.
Voralux® HF505 high molecular weight polyol curative having a number average molecular weight, MN, of 11,400 and an average of six hydroxyl groups per molecule is available from The Dow Chemical Company.

The ungrooved, polishing layer materials from each of Comparative Examples C1-C9 and Examples 1-14 were analyzed to determine their physical properties as reported in TABLE 3. Note that the density data reported were determined according to ASTM D1622; the Shore D hardness data reported were determined according to ASTM D2240; and, the elongation to break data reported were determined according to ASTM D412.

The shear modulus, G', and the shear loss modulus, G", of the polishing layers were measured according to ASTM D5279-13 using a TA Instruments ARES Rheometer with torsion fixtures. Liquid nitrogen that was connected to the instrument was used for sub-ambient temperature control. The linear viscoelastic response of the samples was measured at a test frequency of 1 Hz with a temperature ramp of 3° C./min from −100° C. to 200° C. The test samples were stamped out of product polishing layers using a 47.5 mm×7 mm die on an Indusco hydraulic swing arm cutting machine and then cut down to approximately 35 mm in length using scissors.

The cut rate data reported in TABLE 3 were measured using a Buehler Ecomet® 4 polisher outfitted with an Automet® 2 power head. The polishing tool is designed to accommodate a circular chemical mechanical polishing pad mounted to the polishing platen of the polisher using a double sided pressure sensitive adhesive film.

An LPX-AR3B66 (LPX-W) diamond conditioning disk (commercially available from Saesol Diamond Ind. Co., Ltd.) and an AM02BSL8031C1-PM (AK45) diamond conditioning disk (also commercially available from Saesol Diamond Ind. Co., Ltd.) were used to abrade the polishing surface of the polishing layers as reported in TABLE 3 using the following process conditions: the polishing surface of the polishing layers were subjected to continuous abrasion from the diamond conditioning disk for a period of 99 minutes, with a platen speed of 180 rpm, a deionized water flow rate of 280 mL/min and a conditioning disk down force of 55.16 kPa (8 psi). The cut rate was determined by measuring the change in polishing layer thickness over time. The polishing layer thickness change was measured (in µm/min) using an MTI Instruments Microtrack II Laser Triangulation Sensor mounted on a Zaber Technologies Motorized Slide to profile the polishing surface of each polishing layer from the center to the outer edge. The sweep speed of the sensor on the slide was 0.732 mm/s and the sampling rate (measurements/mm of sweep) for the sensor was 6.34 points/mm. The cut rate reported in TABLE 3 is the arithmetic average reduction in polishing layer thickness over time, based on the collected thickness measurements taken as >2,000 points across the polishing surface of the polishing layer.

TABLE 3

| Ex.# | Density (g/cm³) | Shore D (15 s) Hardness | G' @ 30° C. (MPa) | G' @ 40° C. (MPa) | G" @ 40° C. (MPa) | G'@30° C./ G'@90° C. | Tensile strength (MPa) | Elongation to break (%) | Tensile modulus MPa | Toughness (MPa) | Wet cut rate (μm/min) LPX-W | Wet cut rate (μm/min) AK45 |
|---|---|---|---|---|---|---|---|---|---|---|---|---|
| C1 | 0.80 | 59 | 153 | 130 | 13.0 | 3.4 | 22.1 | 124 | 206 | 24 | — | — |
| C2 | 0.95 | 60 | 153 | 122 | 15.0 | 3.3 | 30.6 | 199 | 303 | — | 3.7 | 2.8 |
| C3 | 1.07 | 63 | 230 | 199 | 17.0 | 2.2 | — | — | — | — | 3.9 | 2.8 |
| C4 | 0.82 | 50 | 105 | 92 | 8.6 | 2.7 | 18.8 | 230 | 185 | 35 | 4.9 | — |
| C5 | 0.82 | 58 | — | — | — | — | — | — | — | — | — | — |
| C6 | 0.82 | 53 | — | — | — | — | — | — | — | — | — | — |
| C7 | 0.80 | 51 | — | — | — | — | — | — | — | — | — | — |
| C8 | 0.86 | 46 | 87 | 81 | 5.5 | 1.7 | 17.9 | 470 | 172 | 63 | — | — |
| C9 | 0.88 | 41 | 64 | 49 | 3.2 | 1.9 | 14.9 | 293 | 95 | 32 | 2.5 | 3.2 |
| 1 | 0.83 | 44 | 73 | 64 | 6.1 | 2.3 | 15.3 | 223 | 129 | 42 | 6.7 | 6.3 |
| 2 | 0.93 | 49 | 80 | 69 | 7.1 | 2.2 | 19.8 | 290 | 138 | 26 | — | — |
| 3 | 0.82 | 47 | 88 | 77 | 6.8 | 2.6 | 17.6 | 238 | 149 | 33 | 6.2 | — |
| 4 | 0.91 | 52 | 99 | 86 | 7.8 | 2.4 | 22.3 | 247 | 164 | 41 | — | — |
| 5 | 0.84 | 49 | 103 | 89 | 9.3 | 2.7 | 17.2 | 231 | 188 | 33 | — | — |
| 6 | 0.94 | 54 | 123 | 106 | 10.6 | 2.7 | 22.7 | 294 | 207 | 52 | — | — |
| 7 | 0.83 | 50 | 105 | 92 | 8.7 | 2.6 | 19.5 | 211 | 173 | 33 | 5.9 | 6.7 |
| 8 | 0.95 | 54 | 126 | 107 | 10.2 | 2.6 | 23.6 | 237 | 193 | 43 | 5.1 | — |
| 9 | 0.82 | 51 | 182 | 155 | 13.0 | 3.3 | 19.0 | 243 | 192 | 37 | — | — |
| 10 | 0.90 | 53 | 144 | 123 | 12.2 | 3.1 | 23.5 | 280 | 230 | 51 | — | — |
| 11 | 0.80 | 52 | 140 | 119 | 12.0 | 3.0 | 20.7 | 184 | 199 | 31 | 4.9 | 6.6 |
| 12 | 0.93 | 53 | 174 | 148 | 15.5 | 3.3 | 20.3 | 205 | 223 | 35 | — | — |
| 13 | 0.91 | 57 | 165 | 136 | 15.4 | 3.8 | 25.0 | 259 | 272 | 52 | — | — |
| 14 | 0.79 | 54 | 154 | 131 | 12.6 | 3.1 | 21.8 | 147 | 222 | 26 | 5.0 | 5.7 |

Polishing Experiments

Chemical mechanical polishing pads were constructed using polishing layers prepared according to the Examples as noted in noted in Table 4. These polishing layers were then machine grooved to provide a groove pattern in the polishing surface comprising a plurality of concentric circular grooves having dimensions of 70 mil (1.78 mm) pitch, 20 mil (0.51 mm) width and 30 mil (0.76 mm) depth. The polishing layers were then laminated to a foam sub-pad layer (FSP 350 available from Rohm and Haas Electronic Materials CMP Inc.).

An Applied Materials Reflexion LK® CMP polishing platform was used to polish 300 mm 3S20KTEN TEOS (oxide) blanket wafers available from Novellus Systems, Inc. with the noted chemical mechanical polishing pads. The polishing medium used in the polishing experiments was a CES333F polishing slurry (1:2 dilution ratio with deionized water) (commercially available from Asahi Glass Company). The polishing conditions used in all of the polishing experiments included a platen speed of 92 rpm; a carrier speed of 93 rpm; with a polishing medium flow rate of 250 ml/min and a down force of 20.7 kPa. An I-PDA31G-3N diamond conditioning disk (commercially available from Kinik Company) was used to condition the chemical mechanical polishing pads. The chemical mechanical polishing pads were each broken in with the conditioner ex situ using a down force of 7.5 lbs (3.40 kg) for 40 minutes. The polishing pads were further conditioned ex situ prior to polishing using a down force of 7.5 lbs (3.40 kg) for 18 seconds. The removal rates were determined by measuring the film thickness before and after polishing using a KLA-Tencor FX200 metrology tool using a 49 point spiral scan with a 3 mm edge exclusion. The results of the removal rate experiments are provided in TABLE 4.

TABLE 4

| Polishing layer of Ex. # | TEOS removal rate (Å/min) | $TEOS_{300-RR}$/Shore D Hardness (Å/min) |
|---|---|---|
| C1 | 1518 | 25.73 |
| C7 | 1401 | 27.47 |
| 5 | 2365 | 48.27 |
| 6 | 1696 | 31.41 |
| 9 | 2149 | 42.14 |
| 10 | 1495 | 28.21 |
| 11 | 1780 | 34.23 |
| 12 | 2633 | 49.68 |
| 13 | 1986 | 34.84 |

We claim:

1. A chemical mechanical polishing pad adapted for polishing a substrate selected from the group consisting of at least one of a magnetic substrate, an optical substrate and a semiconductor substrate, comprising:
    a polishing layer adapted for polishing a substrate selected from the group consisting of at least one of a magnetic substrate, an optical substrate and a semiconductor substrate having a polishing surface, wherein the polishing layer comprises a reaction product of ingredients, comprising:
    an isocyanate terminated urethane prepolymer having 8.75 to 9.25 wt % unreacted NCO groups; and,
    a curative system consisting essentially of:
        20 to 60 wt % of a high molecular weight polyol curative, wherein the high molecular weight polyol curative has a number average molecular weight, $M_N$, of 10,000 to 12,000; and wherein the high molecular weight polyol curative has an average of 6 hydroxyl groups per molecule and a hydroxyl number (mg KOH/g) of about 30; and,
        40 to 80 wt % of a difunctional curative wherein the polishing layer exhibits a density of greater than 0.6 g/cm³ and the polishing layer includes polymeric microballoons having shell walls and a weight average diameter of 10 to 50 μm and wherein the polishing layer has an elongation to break of 125 to 300% as measured according to ASTM D412.

2. The chemical mechanical polishing pad of claim 1, wherein the curative system has a plurality of reactive hydrogen groups and the isocyanate terminated urethane prepolymer has a plurality of unreacted NCO groups; and wherein a stoichiometric ratio of the reactive hydrogen groups to the unreacted NCO groups is 0.85 to 1.15.

3. The chemical mechanical polishing pad of claim 1, wherein the isocyanate terminated urethane prepolymer has 8.95 to 9.25 wt % unreacted NCO groups.

4. The chemical mechanical polishing pad of claim 1, wherein the polishing surface has a groove pattern formed therein.

5. The chemical mechanical polishing pad of claim 1, wherein the $M_N$ of the high molecular weight polyol curative is about 11,400.

* * * * *